United States Patent
Reichenbach et al.

(10) Patent No.: US 10,000,375 B2
(45) Date of Patent: *Jun. 19, 2018

(54) STRUCTURES AND PROCESS FOR PREVENTING A PROJECTION OF THE LASER RESEALING STRUCTURE BEYOND THE WAFER SURFACE

(71) Applicant: Robert Bosch GmbH, Stuttgart (DE)

(72) Inventors: Frank Reichenbach, Wannweil (DE); Jochen Reinmuth, Reutilngen (DE); Jens Frey, Filderstadt (DE); Julia Amthor, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days. days.

This patent is subject to a terminal disclaimer.

(21) Appl. No.: 15/299,600

(22) Filed: Oct. 21, 2016

(65) Prior Publication Data

US 2017/0113920 A1  Apr. 27, 2017

(30) Foreign Application Priority Data

Oct. 26, 2015  (DE) ........................ 10 2015 220 890

(51) Int. Cl.
*B81B 7/00* (2006.01)
*B81C 1/00* (2006.01)
*B81B 7/02* (2006.01)

(52) U.S. Cl.
CPC .............. *B81B 7/0048* (2013.01); *B81B 7/02* (2013.01); *B81C 1/00293* (2013.01);
(Continued)

(58) Field of Classification Search
CPC ........... B81B 1/00–1/008; B81B 3/00–3/0097; B81B 5/00; B81B 7/00–7/04; B81B 2201/00–2201/13; B81B 2203/00–2203/06; B81B 2207/00–2207/99; B81C 3/00–3/008; B81C 99/00–99/0095;
(Continued)

(56) References Cited

U.S. PATENT DOCUMENTS

2013/0074596 A1* 3/2013 Takizawa .............. B81B 7/0041
73/504.12
2013/0265701 A1* 10/2013 Takizawa ............... H05K 5/069
361/679.01

FOREIGN PATENT DOCUMENTS

WO  2015120939 A1  8/2015

* cited by examiner

*Primary Examiner* — Tucker J Wright
(74) *Attorney, Agent, or Firm* — Norton Rose Fulbright US LLP; Gerard Messina

(57) ABSTRACT

A method for manufacturing a micromechanical component including a substrate and a cap connected to the substrate and together with the substrate enclosing a first cavity, a first pressure prevailing and a first gas mixture with a first chemical composition being enclosed in the first cavity. An access opening, connecting the first cavity to surroundings of the micromechanical component, is formed in the substrate or the cap. The first pressure and/or the first chemical composition is adjusted in the first cavity. The access opening is sealed by introducing energy and heat into an absorbing part of the substrate or cap with the aid of a laser. A recess is formed in a surface of the substrate or of the cap facing away from the first cavity in the area of the access opening for accommodating a material area of the substrate or the cap converted into a liquid aggregate state.

6 Claims, 6 Drawing Sheets

(52) U.S. Cl.
CPC .. *B81C 1/00325* (2013.01); *B81B 2201/0235* (2013.01); *B81B 2201/0242* (2013.01); *B81C 2201/013* (2013.01); *B81C 2203/0145* (2013.01)

(58) Field of Classification Search
CPC ...................... B81C 2201/00–2201/117; B81C 2203/00–2203/0792
See application file for complete search history.

STRUCTURES AND PROCESS FOR PREVENTING A PROJECTION OF THE LASER RESEALING STRUCTURE BEYOND THE WAFER SURFACE

CROSS REFERENCE

The present application claims the benefit under 35 U.S.C. § 119 of German Patent Application No. DE 102015220890.7 filed on Oct. 26, 2015, which is expressly incorporated herein by reference in its entirety.

BACKGROUND INFORMATION

In a method described in PCT Application No. WO 2015/120939 A1, if a certain internal pressure is desired in a cavity of a micromechanical component, or if a gas mixture with a certain chemical composition is to be enclosed in the cavity, then the internal pressure or the chemical composition is frequently adjusted during capping of the micromechanical component or during the bonding process between a substrate wafer and a cap wafer. During capping, for example, a cap is connected to a substrate, whereby the cap and the substrate together surround the cavity. By adjusting the atmosphere or the pressure and/or the chemical composition of the gas mixture present in the surroundings during capping, the certain internal pressure and/or the certain chemical composition may thus be adjusted in the cavity.

Using the method described in PCT Application No. WO 2015/120939 A1, an internal pressure may be adjusted in a targeted way in a cavity of a micromechanical component. Using this method, it is particularly possible to manufacture a micromechanical component with a first cavity, a first pressure and a first chemical composition being adjustable in a first cavity, which differs from a second pressure and a second chemical composition at the point in time of the capping.

In the method for targeted adjusting of an internal pressure in a cavity of a micromechanical component described in PCT Application No. WO 2015/120939 A1, a small access channel to the cavity is generated in the cap or in the cap wafer or in the substrate or in the sensor wafer. The cavity is subsequently flooded with the desired gas and the desired internal pressure via the access channel. Finally, the area around the access channel is locally heated with the aid of a laser, the substrate material liquefies locally, and hermetically seals the access channel during solidification.

SUMMARY

It is an object of the present invention to provide a method for manufacturing a mechanically robust micromechanical component with a long service life compared to the related art in a simple and cost efficient way with respect to the related art. Furthermore, it is the object of the present invention to provide a compact, mechanically robust micromechanical component with a long service life compared to the related art. According to the present invention, this applies in particular to a micromechanical component including one (first) cavity. Using the method according to the present invention and the micromechanical component according to the present invention, it is additionally also possible to implement a micromechanical component in which a first pressure and a first chemical composition may be adjusted in the first cavity, and a second pressure and a second chemical composition may be adjusted in a second cavity. For example, a method of this type is provided for manufacturing micromechanical components for which it is advantageous if a first pressure is enclosed in a first cavity and a second pressure in a second cavity, whereby the first pressure is to be different from the second pressure. This is then, for example, the case, when a first sensor unit for rotation rate measurement and a second sensor unit for acceleration measurement are to be integrated in one micromechanical component.

The object may be achieved, for example,
in a fourth method step, a recess is formed in a surface of the substrate or of the cap facing away from the first cavity in the area of the access opening for accommodating a material area of the substrate or the cap converted into a liquid aggregate state in the third method step.

Thus, in a simple and cost-efficient way, a method is provided for manufacturing a micromechanical component, with which the solidified material area is manufacturable as recessed into the substrate or into the cap relative to the surface. Compared to a method without formation of the recess, the method according to the present invention has the advantage, for example, that the solidified material area projects less far beyond the surface, so that the solidified material area offers less contact surface for mechanical shocks. Thus, the solidified material area and/or the interfaces between the solidified material area and the remaining substrate or the remaining cap and/or the area around the interfaces are less susceptible to crack formations. In other words, the solidified material area is less susceptible to damages and to unintentional contact, for example, during the manufacturing flow, and is thus also less likely to be the cause or originating point of cracks due to the method according to the present invention. Using the method according to the present invention, it is also less problematic if the substrate material is only locally heated and the heated material shrinks together both during solidification as well as during cooling relative to its surroundings. The fact that a very large tensile stress may thus be generated in the sealing area is also less problematic, since, by recessing the solidified material, the contact surface is minimized with respect to mechanical shocks. Thus, spontaneously occurring crack formation is also less probable, depending on the tension and the material. Crack formation under thermal or mechanical load of the micromechanical component during further processing or in the field is also less probable, since the area of the sealed access opening is better protected. In particular, it is less critical, when using the method according to the present invention, if a point or a projection of the point forms beyond the surface of the substrate or of the cap in the center of the melted zone or in the center of the solidified material area during solidification of the material area due to the recrystallization dynamic. The probability of damage to such a point or an unintentional contact of the point during the further manufacturing flow may be effectively reduced by using the recess. In particular, it is advantageously possible according to the present invention that the point lies below an otherwise (i.e., except for the area of the access opening) generally planar surface of the cap or of the substrate. Thus, the method according to the present invention is an effective possibility for reducing the probability that the point is the cause or the originating point for cracks. Thus, a method for manufacturing a mechanically robust micromechanical component having a long service life in a simple and cost-efficient way is provided compared to the related art.

In connection with the present invention, the term "micromechanical component" is to be understood in that the term includes micromechanical components as well as microelectromechanical components.

The present invention is provided preferably for the manufacturing of or for a micromechanical component with a cavity. However, the present invention is also provided, for example, for a micromechanical component with two cavities or with more than two, i.e., three, four, five, six, or more than six cavities.

The access opening is preferably sealed by the introduction of energy and heat into a part of the substrate or the cap absorbing this energy and this heat with the aid of a laser. Energy and heat is hereby preferably introduced chronologically in series in the respective absorbing part of the substrate or of the cap of multiple micromechanical components, which are collectively manufactured on a wafer. However, a chronologically parallel introduction of the energy and heat into the respective absorbing part of the substrate or the cap of multiple micromechanical components is alternatively provided, for example, by using multiple laser beams or laser devices.

Advantageous embodiments and refinements of the present invention are described below with reference to the figures.

According to one preferred refinement, it is provided that the cap together with the substrate encloses a second cavity, a second pressure prevailing and a second gas mixture with a second chemical composition being enclosed in the second cavity.

Another subject matter of the present invention is a method for manufacturing a micromechanical component including a substrate and a cap connected to the substrate and enclosing together with the substrate a first cavity and a second cavity, a first pressure prevailing and a first gas mixture with a first chemical composition being enclosed in the first cavity, a second pressure prevailing and a second gas mixture with a second chemical composition being enclosed in the second cavity:
  in a first method step, an access opening connecting the first cavity to surroundings of the micromechanical component being formed in the substrate or in the cap;
  in a second method step, the first pressure and/or the first chemical composition being adjusted in the first cavity;
  in a third method step, the access opening being sealed by introducing energy and heat into an absorbing part of the substrate or the cap with the aid of a laser;
  in a fourth method step: a recess being formed in a surface of the substrate or of the cap facing away from the first cavity in the area of the access opening for accommodating a material area of the substrate or the cap converted into a liquid aggregate state in the third method step.

According to one preferred refinement, the recess is formed in such a way that the solidified material area is situated between a plane extending generally along the surface and the first cavity. Thus, in an advantageous way, the solidified material area does not protrude beyond the surface so that the solidified material offers even less contact surface for mechanical shocks. Thus, the solidified material area and/or the interfaces between the solidified material area and the remaining substrate or the remaining cap and/or the area around the interfaces is/are less susceptible to crack formations.

According to one preferred refinement, it is provided that the recess is formed in such a way that a first surface of a projection of the recess onto a plane extending generally along the surface is larger than a second surface of a projection of the solidified material area or of the absorbing part of the substrate or of the cap onto the plane. Thus, it is advantageously made possible that, when the recess is planarly lowered in comparison to the surface by at least the height of the projection to be expected of the material area beyond the surface in a method without a recess, a projection of the solidified material area beyond the surface is prevented.

According to one preferred refinement, it is provided that the recess is formed in such a way that a first surface of a projection of the recess onto a plane extending generally along the surface is smaller than a second surface of a projection of the solidified material area or of the absorbing part of the substrate or of the cap onto the plane. Thus, in an advantageous way, the amount of the material area of the substrate or of the cap converted into the liquid aggregate state is reducible, and a melting bath, generated by the introduction of the energy, may flow better without requiring an unnecessarily large area of the surface for forming the recess.

According to one preferred refinement, it is provided that the recess is formed in a plane extending generally in parallel to the surface, generally rotationally symmetrical with respect to the access channel or to the material area or to the absorbing part of the substrate or of the cap. Thus, the melting bath may flow in a particularly advantageous way.

According to one preferred refinement, it is provided that the recess is etched anisotropically into the surface. Thus, it is advantageously made possible that the recess may be provided to be anisotropic or oblong, in the sense of a larger extension of the recess generally perpendicular to the surface than in parallel to the surface or in the sense of a smaller extension of the recess generally perpendicular to the surface than in parallel to the surface.

According to one preferred refinement, it is provided that the fourth method step is carried out chronologically after the first method step. Thus, it is advantageously made possible that the recess is introduced into the surface with the present access channel.

According to one preferred refinement, it is provided that an additional recess or preferably a plurality of additional recesses are formed in the surface in the area of the access opening in the fourth method step for accommodating a material area of the substrate or of the cap converted into a liquid aggregate state in the third method step.

According to one preferred refinement, it is provided that the recess or the additional recess or the plurality of additional recesses are structured with the aid of a hardmask.

In addition, another subject matter of the present invention is a micromechanical element including a substrate and a cap connected to the substrate and enclosing together with the substrate a first cavity, a first pressure prevailing and a first gas mixture with a first chemical composition being enclosed in the first cavity, the substrate or the cap including a sealed access opening, the substrate or the cap including: a recess situated in a surface of the substrate or of the cap facing away from the first cavity in the area of the access opening for accommodating a material area of the substrate or the cap converted into a liquid aggregate state during sealing of the access opening.

According to one preferred refinement, it is provided that the cap together with the substrate encloses a second cavity, a second pressure prevailing and a second gas mixture with a second chemical composition being enclosed in the second cavity.

Furthermore, another subject matter of the present invention is a micromechanical element including a substrate and a cap connected to the substrate and together with the substrate encloses a first cavity and a second cavity, a first pressure prevailing and a first gas mixture with a first chemical composition being enclosed in the first cavity, a second pressure prevailing and a second gas mixture with a second chemical composition being enclosed in the second cavity, the substrate or the cap includes a sealed access opening, the substrate or the cap including: a recess situated in a surface of the substrate or of the cap facing away from the first cavity in the area of the access opening for accommodating a material area of the substrate or the cap converted into a liquid aggregate state during sealing of the access opening. Thus, a compact, mechanically robust, and cost-efficient micromechanical component is provided in an advantageous way with adjusted first pressure and second pressure. The mentioned advantages of the method according to the present invention correspondingly also apply for the micromechanical component according to the present invention.

According to one preferred refinement, it is provided that the recess is formed in such a way that the solidified material area is situated between a plane extending generally along the surface and the first cavity. Thus, in an advantageous way, a micromechanical component is provided which is particularly robust against mechanical shocks.

According to one preferred refinement, it is provided that the first pressure is lower than the second pressure, a first sensor unit for measuring the rotation rate being situated in the first cavity and a second sensor unit for measuring the acceleration being situated in the second cavity. Thus, a mechanically robust micromechanical component for measuring the rotation rate and the acceleration is provided with optimum operating conditions both for the first sensor unit and for the second sensor unit.

DETAILED DESCRIPTION OF EXAMPLE EMBODIMENTS

Figure 1:
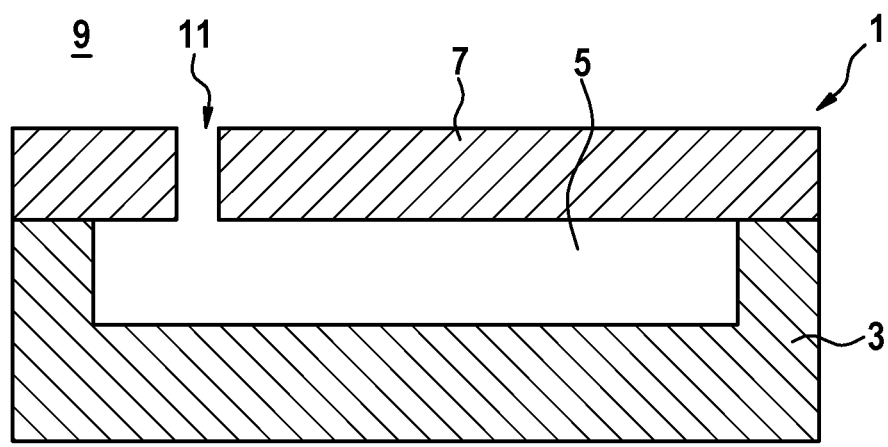
FIG. 1 shows a micromechanical component including an open access opening according to one exemplary specific embodiment of the present invention in a schematic representation.

In the different figures, identical parts are provided with identical reference numerals and are therefore generally also only named or mentioned once.

Figure 2:
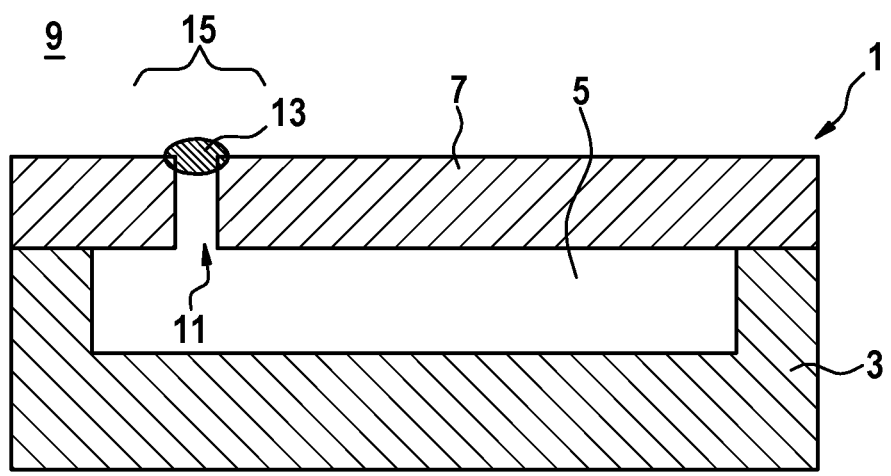
FIG. 2 shows the micromechanical component according to FIG. 1a including a sealed access opening in a schematic representation.

In FIG. 1 and FIG. 2, a schematic depiction of a micromechanical component 1 including an open access opening 11 is shown in FIG. 1, and including a sealed access opening 11 in FIG. 2 according to one exemplary specific embodiment of the present invention. Micromechanical component 1 hereby includes a substrate 3 and a cap 7. Substrate 3 and cap 7 are connected to one another, preferably hermetically, and together enclose a first cavity 5. For example, micromechanical component 1 is formed in such a way that substrate 3 and cap 7 additionally together enclose a second cavity.

For example, a first pressure prevails in first cavity 5, in particular in the case of sealed access opening 11, as shown in FIG. 2. In addition, a first gas mixture with a first chemical composition is enclosed in first cavity 5. Furthermore, for example, a second pressure prevails in the second cavity and a second gas mixture with a second chemical composition is enclosed in the second cavity. Access opening 11 is preferably situated in substrate 3 or in cap 7. In the case of the exemplary embodiment presented here, access opening 11 is situated for example in cap 7. According to the present invention, however, it may also be alternatively provided that access opening 11 is situated in substrate 3.

It is provided, for example, that the first pressure in first cavity 5 is lower than the second pressure in the second cavity.

It is also provided, for example, that a first micromechanical sensor unit for measuring the rotation rate is situated in first cavity 5, not shown in FIG. 1 and FIG. 2, and a second micromechanical sensor unit for measuring the acceleration is situated in the second cavity, not shown in FIG. 1 and FIG. 2.

Figure 3:
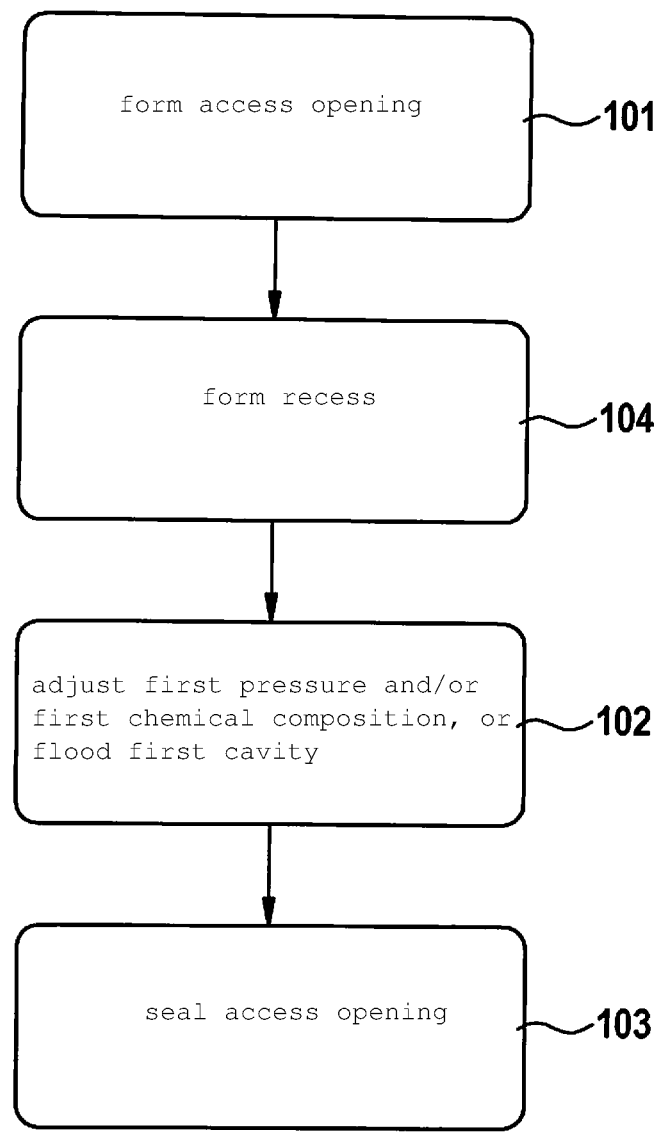
FIG. 3 shows a method for manufacturing a micromechanical component according to one exemplary specific embodiment of the present invention in a schematic representation.

A method for manufacturing micromechanical component 1 according to an exemplary specific embodiment of the present invention is shown in a schematic representation in FIG. 3. For this purpose, in a first method step 101, in particular, narrow access opening 11 in substrate 3 or in cap 7 is formed connecting first cavity 5 to surroundings 9 of micromechanical component 1. FIG. 1 shows, for example, micromechanical component after first method step 101. In addition, in a second method step 102, the first pressure and/or the first chemical composition is adjusted in first cavity 5, or first cavity 5 is flooded with the desired gas and the desired internal pressure via the access channel. Furthermore, for example, in a third method step 103, access opening 11 is sealed by introducing energy and heat into an absorbing part 21 of substrate 3 or cap 7 with the aid of a laser. It is, for example, also provided that in third method step 103, the area around the access channel is merely preferably only locally heated by a laser and the access channel is hermetically sealed. Thus, it is advantageously possible to also provide the method according to the present invention with other energy sources besides a laser for sealing access opening 11. FIG. 2 shows, for example, micromechanical component 1 after third method step 103.

Chronologically after third method step 103, mechanical stresses may occur in a lateral area 15, shown, for example, in FIG. 2, on surface 19, and in the depth perpendicular to a projection of lateral area 15 onto surface 19, i.e. along access opening 11 and in the direction of first cavity 5 of micromechanical component 1. These mechanical stresses, in particular local mechanical stresses, prevail in particular on or in the vicinity of an interface between a material area 13 of cap 7, which seals access opening 11 in a liquid aggregate state in third method step 103 and transitions into a solid aggregate state after third method step 103, and a residual area of cap 7, which remains in a solid aggregate state during third method step 103. In FIG. 2, material area 13 of cap 7 sealing access opening 11 is hereby merely indicated schematically or schematically depicted, in particular with respect to its lateral extension or form extending in particular in parallel to surface 19, and in particular with respect to its expansion or configuration running perpendicular to the lateral extension, in particular perpendicular to surface 19.

As is shown as an example in FIG. 3, additionally,
in a fourth method step 104: a recess 17 is formed in a surface 19 of substrate 3 or of cap 7 facing away from first cavity 5 in the area of access opening 11 for accommodating or partially accommodating a material area 13, converted into a liquid aggregate state in third method step 103, or an absorbing part 21, converted at least partially into a liquid aggregate state, of substrate 3 or cap 7. As is shown by way of example in FIG. 3, fourth method step 104 is carried out, for example, chronologically after first method step 101 and chronologically before second method step 102. It is, however, alternatively also provided that fourth method step 104 is carried out chronologically after first method step 101 or chronologically after second method step 102. Thus, the method according to the present invention may be advantageously adapted to different manufacturing processes in a simple way.

In particular, it is provided that before the laser resealing or chronologically before first method step 101, structures or recess 17 or a plurality of recesses 17 are introduced into surface 19 or the silicon surface in the area of the access channel or access opening 11 in order to lower or to sink the sealing plane or material area 13 so that the projection occurring during the solidification of the melting bath lies below the wafer surface or surface 19.

Figure 4:
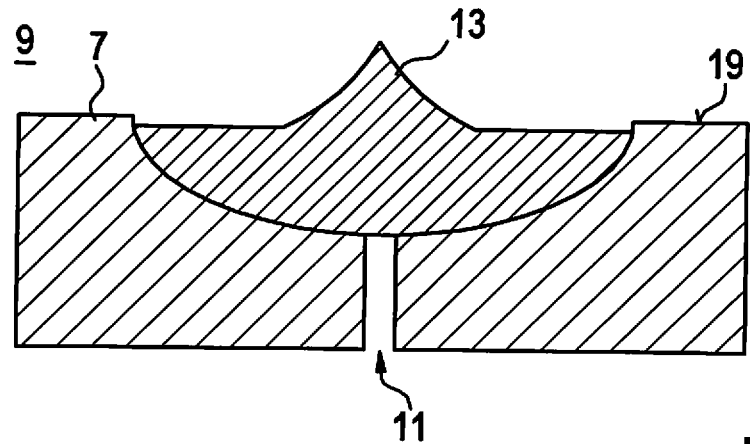
FIG. 4 shows a material area of a substrate or of a cap of a micromechanical component according to an additional exemplary specific embodiment of the present invention in a schematic representation.
Figure 5:
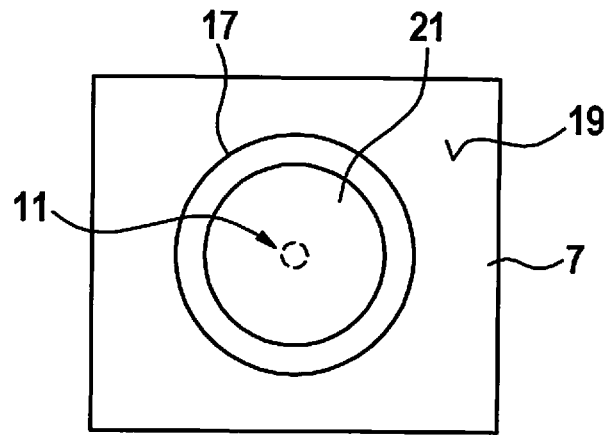
FIG. 5 shows a micromechanical component according to a third exemplary specific embodiment of the present invention at different points in time of the method according to the present invention in a schematic representation.
Figure 5:
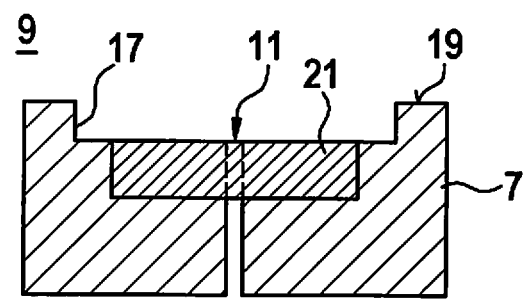
Figure 5:
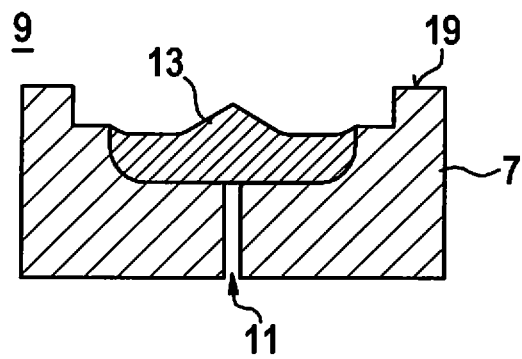
Figure 6:
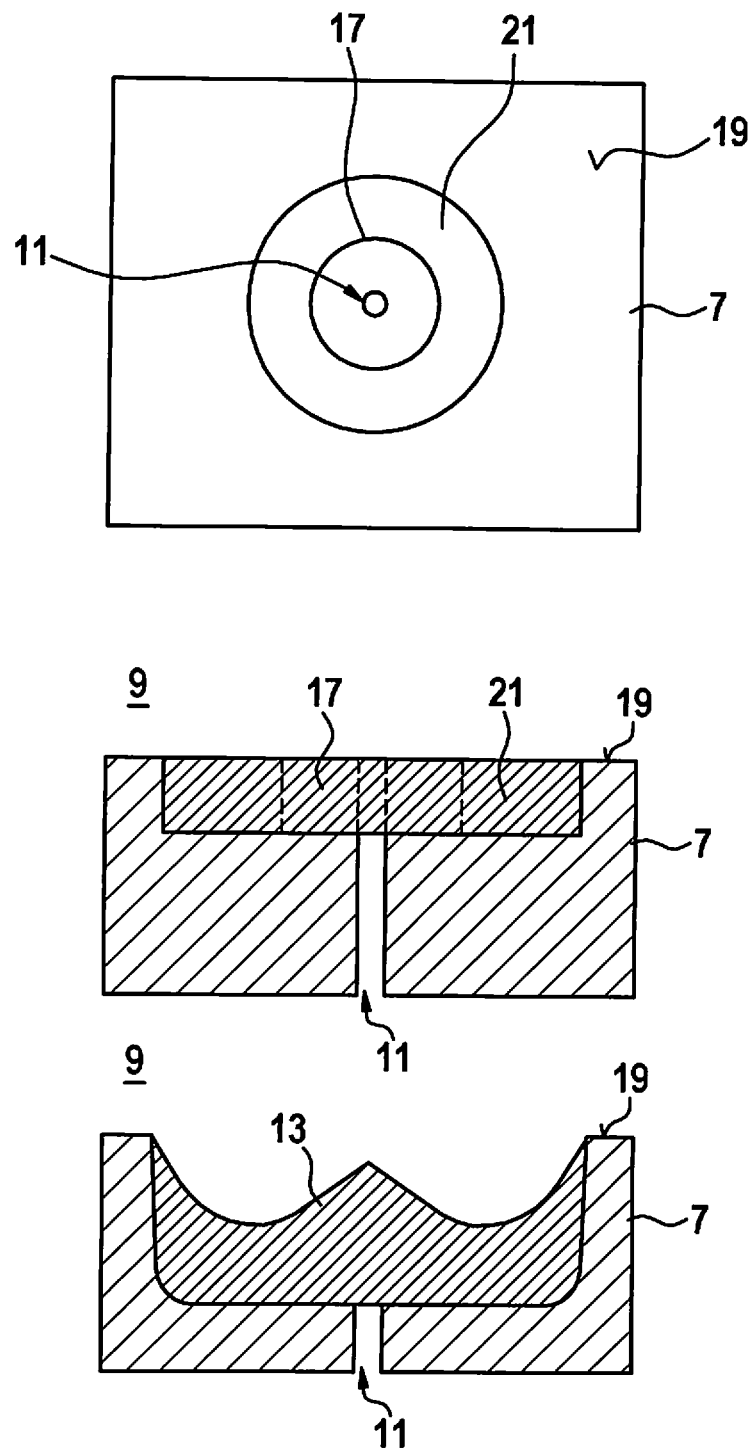
FIG. 6 shows a micromechanical component according to a fourth exemplary specific embodiment of the present invention at different points in time of the method according to the present invention in a schematic representation.
Figure 7:
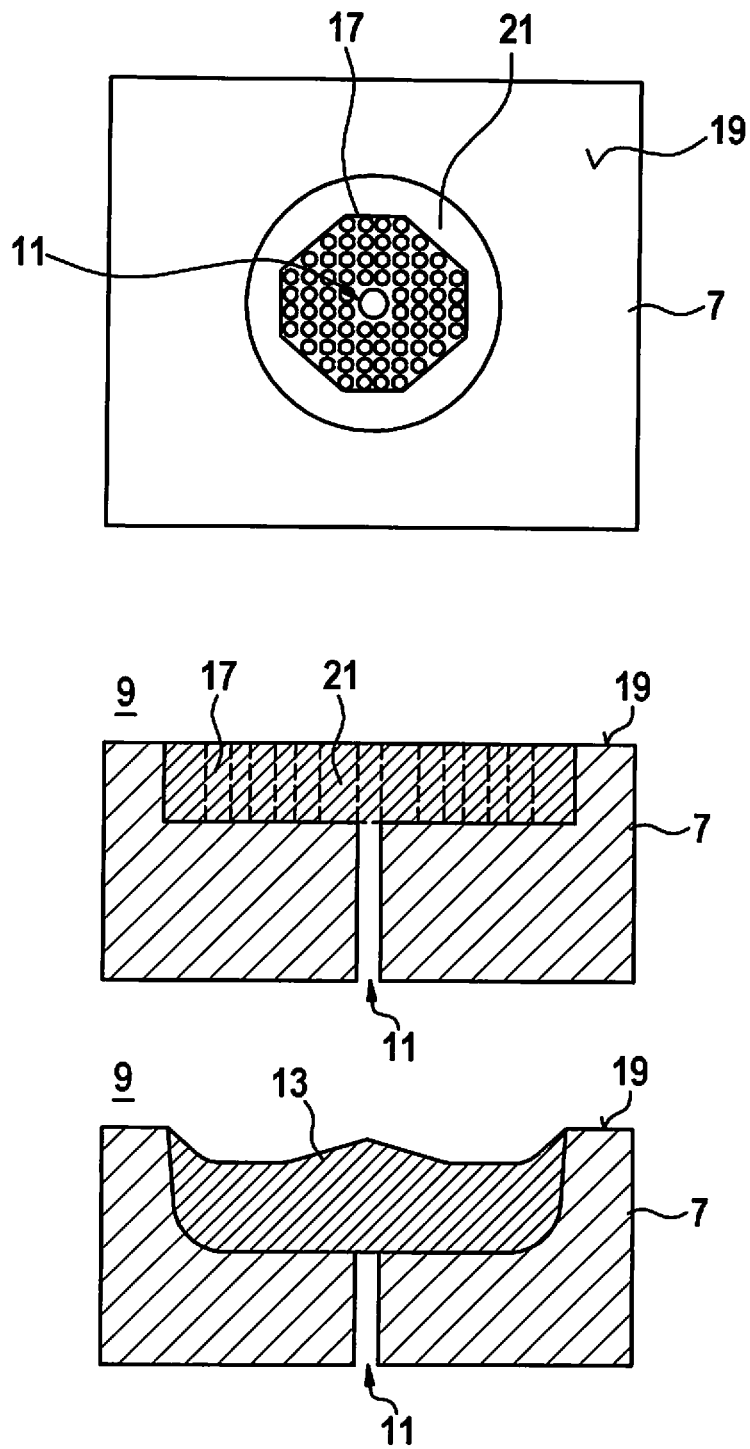
FIG. 7 shows a micromechanical component according to a fifth exemplary specific embodiment of the present invention at different points in time of the method according to the present invention in a schematic representation.

FIG. 4 shows an already solidified material area 13 of substrate 3 or of cap 7 according to an additional exemplary specific embodiment in a schematic representation. Solidified material area 13 or the point hereby protrudes beyond surface 19 of cap 7. In FIG. 5, FIG. 6, and FIG. 7, micromechanical component 1 is shown according to a third, a fourth, and a fifth exemplary specific embodiment at different points in time of the method according to the present invention in schematic representations. Multiple different structures or structures of recesses 17 are described, the structures being preferably anisotropically etched into surface 19 or the silicon surface. For example, cap 7 hereby includes recess 17 situated in surface 19 of cap 7 facing away from first cavity 5. In the exemplary embodiment shown in FIG. 7, cap 7 includes a plurality of recesses 17. Furthermore, recess 17 or the plurality of recesses 17 is situated in the area of access opening 11 for accommodating a material area 13 of cap 7 converted into a liquid aggregate state during a sealing of access opening 11. In all exemplary embodiments shown in FIG. 5, FIG. 6, and FIG. 7, recess 17 or the plurality of recesses 17 is formed in such a way that solidified material area 13 is situated between a plane extending generally along surface 19 and first cavity 5.

FIG. 5 shows a micromechanical component 1 at different points in time during a method according to the present invention, recess 17 being formed in such a way that a first surface of a projection of recess 17 onto a plane extending generally along surface 19 is larger than a second surface of a projection of solidified material area 13 or of absorbing part 21 of substrate 3 or cap 7 onto the plane. For example, it is additionally or alternatively also provided that for lowering the resealing projection, advantageously a flat area, which is larger than the melting area, is etched around the access channel with the aid of anisotropic etching. The etching depth is hereby, for example, at least the height of the projection to be expected. Furthermore, the size of the flat area is selected, for example, in such a way that the melting area always lies within all tolerances under consideration.

In addition, FIG. 6 shows a micromechanical component 1 at different points in time during a method according to the present invention, recess 17 being formed in such a way that a first surface of a projection of recess 17 onto a plane extending generally along surface 19 is smaller than a second surface of a projection of solidified material area 13 or of absorbing part 21 of substrate 3 or cap 7 onto the plane.

Furthermore, FIG. 7 shows a micromechanical component 1 at different points in time during a method according to the present invention, recess 17 being formed in a plane extending generally in parallel to surface 19 generally rotationally symmetrical with respect to access channel 11 or to material area 13 or to absorbing part 21 of substrate 3 or of cap 7. In particular, in the exemplary embodiment shown in FIG. 7, recess 17 or the plurality of recesses 17 is etched anisotropically into surface 19.

FIG. 6 and FIG. 7 show by way of example that the amount of material which is melted during the laser resealing may be reduced by one or multiple etched individual structures in such a way that the melting bath may flow and no longer protrude beyond wafer surface 19 after solidification. The depth, to which the structures extend in silicon surface 19, may be adapted to the proportion of etched surface within the melting area. The more material is removed, the less depth is required for the etching. However, it must be ensured that the remaining material is sufficient for sealing access channel 11.

Finally, it is preferably provided that an area, which is larger than the melting area, is planarly lowered by at least the height of the projection to be expected or the amount of melting material is reduced in the melting area by one or multiple individual structures etched into surface 19 so that the melting bath may flow. In this case, the depth, to which the structures extend into silicon surface 19, may be from a few micrometers to past the melting depth of cap 7 or substrate 3 or of the silicon. For example, it is also provided that recess 17 or the plurality of recesses 17 or the structures are combined with structures for stress release.

What is claimed is:
1. A method for manufacturing a micromechanical component including a substrate and a cap connected to the substrate and together with the substrate enclosing a first cavity, a first pressure prevailing and a first gas mixture with a first chemical composition being enclosed in the first cavity, the method comprising:

in a first step, forming an access opening, connecting the first cavity to surroundings of the micromechanical component, in the substrate or in the cap;

in a second step, adjusting at least one of the first pressure and the first chemical composition in the first cavity;

in a third step, sealing the access opening with a material of the substrate or the cap by introducing energy and heat into an absorbing area of the substrate or the cap with the aid of a laser, wherein the introduction of the heat and energy melts a portion of the substrate or cap into a liquid aggregate state; and in a fourth step, forming a recess in a first surface of the substrate or of the cap facing away from the first cavity in the area of the access opening for accommodating the melted portion of the substrate or the cap.

2. The method as recited in claim 1, wherein the melted portion of substrate or cap solidifies to form a solidified material area after the third step, and wherein the recess is formed in such a way that the solidified material area is situated between a plane extending along the first surface of the substrate or cap and a plane extending along a second surface of the substrate or cap, the second surface facing the cavity.

3. The method as recited in claim 1, wherein the melted portion of the substrate or cap solidifies to form a solidified material area after the third step, and wherein the recess is formed in such a way that a first surface of a projection of the recess onto a plane extending along the first surface of the substrate or cap is larger than a second surface of a projection of the solidified material area or of the absorbing part of the substrate or of the cap onto the plane.

4. The method as recited in claim 1, wherein the melted portion of the substrate or cap solidifies to form a solidified material area after the third step, and wherein the recess is formed in such a way that a first surface of a projection of the recess onto a plane extending along the first surface of the substrate or cap is smaller than a second surface of a projection of the solidified material area or of the absorbing part of the substrate or of the cap onto the plane.

5. The method as recited in claim 1, wherein the recess is formed in a plane extending in parallel to the first surface of the substrate or cap, rotationally symmetrical to the access channel or to the melted portion or to the absorbing part of the substrate or of the cap.

6. The method as recited in claim 1, wherein the recess is anisotropically etched into the first surface of the substrate or cap.

* * * * *